United States Patent
Chang et al.

(10) Patent No.: US 7,928,013 B1
(45) Date of Patent: Apr. 19, 2011

(54) DISPLAY PANEL AND REWORK METHOD OF GATE INSULATING LAYER OF THIN FILM TRANSISTOR

(75) Inventors: Chia-Hsu Chang, Hsin-Chu (TW); Pei-Yu Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/628,229

(22) Filed: Dec. 1, 2009

(30) Foreign Application Priority Data

Oct. 15, 2009 (TW) .............................. 98134944 A (51) Int. Cl.
*H01L 21/302* (2006.01)

(52) U.S. Cl. ........ 438/710; 438/711; 438/712; 438/713; 438/714; 438/715; 257/E21.218; 257/E21.413; 257/E29.137

(58) Field of Classification Search .......... 438/710–720; 257/E21.218, E21.413, E27.411, E29.137, 257/E29.151, E29.278, E29.293
See application file for complete search history.

(56) References Cited

U.S. PATENT DOCUMENTS

| | | | | |
|---|---|---|---|---|
| 5,118,639 A | * | 6/1992 | Roth et al. ..................... | 438/300 |
| 5,402,254 A | * | 3/1995 | Sasano et al. ................... | 349/38 |
| 6,197,151 B1 | * | 3/2001 | Kaji et al. .................. | 156/345.46 |
| 6,299,293 B1 | * | 10/2001 | Imanaka et al. ................ | 347/58 |
| 6,395,586 B1 | | 5/2002 | Huang et al. | |
| 6,468,437 B1 | * | 10/2002 | Kashino et al. .................. | 216/27 |
| 6,686,294 B2 | * | 2/2004 | Kawai .......................... | 438/714 |
| 7,358,197 B2 | * | 4/2008 | Han et al. ...................... | 438/763 |
| 2002/0046986 A1 | * | 4/2002 | Kawai .......................... | 216/58 |
| 2003/0216031 A1 | * | 11/2003 | Komagata .................... | 438/636 |
| 2005/0042785 A1 | * | 2/2005 | Okamoto ....................... | 438/30 |
| 2006/0088774 A1 | * | 4/2006 | Yoshikawa et al. .............. | 430/5 |
| 2006/0205129 A1 | * | 9/2006 | Sato et al. ..................... | 438/197 |
| 2006/0273347 A1 | * | 12/2006 | Hikita et al. ................... | 257/192 |
| 2007/0018199 A1 | * | 1/2007 | Sheppard et al. ............. | 257/200 |
| 2007/0035207 A1 | * | 2/2007 | Kawamura et al. ........... | 310/324 |
| 2008/0150027 A1 | * | 6/2008 | Okamoto et al. .............. | 257/347 |
| 2009/0004872 A1 | * | 1/2009 | Okamoto ....................... | 438/720 |
| 2009/0098709 A1 | * | 4/2009 | Ohnuma et al. ................ | 438/458 |
| 2010/0117118 A1 | * | 5/2010 | Dabiran et al. ................ | 257/190 |
| 2010/0140735 A1 | * | 6/2010 | Bommena et al. ............. | 257/506 |

FOREIGN PATENT DOCUMENTS

| | | |
|---|---|---|
| JP | 04311032 | 11/1992 |
| JP | 11274143 | 10/1999 |

\* cited by examiner

*Primary Examiner* — N Drew Richards
*Assistant Examiner* — Ankush k Singal
(74) *Attorney, Agent, or Firm* — Winston Hsu; Scott Margo (57) ABSTRACT

A rework method of a gate insulating layer of a thin film transistor includes the following steps. First, a substrate including a silicon nitride layer, which serves as a gate insulating layer, disposed thereon. Subsequently, a first film removal process is performed to remove the silicon nitride layer. The first film removal process includes an inductively coupled plasma (ICP) etching process. The ICP etching process is carried out by introducing gases including sulfur hexafluoride and oxygen. The ICP etching process has an etching selectivity ratio of the silicon nitride layer to the substrate, which is substantially between 18 and 30.

18 Claims, 11 Drawing Sheets

| Location | Thickness difference of the glass substrate |
|---|---|
| 1 | 99 |
| 2 | 91 |
| 3 | 100 |
| 4 | 109 |
| 5 | 122 |
| 6 | 130 |
| 7 | 114 |
| 8 | 160 |
| 9 | 164 |
| 10 | 145 |
| 11 | 214 |
| 12 | 191 |
| 13 | 233 |
| 14 | 201 |
| 15 | 188 |
| 16 | 174 |
| 17 | 181 |
| 18 | 160 |
| 19 | 153 |
| 20 | 146 |
| 21 | 97 |
| 22 | 103 |
| 23 | 96 |
| 24 | 109 |
| 25 | 120 |
| Average | 144 |

DISPLAY PANEL AND REWORK METHOD OF GATE INSULATING LAYER OF THIN FILM TRANSISTOR

BACKGROUND OF THE DISCLOSURE

1. Technical Field

The present disclosure relates to a rework method of a gate insulating layer of a thin film transistor (TFT) and a display panel manufactured thereby, and more particularly, to a rework method that an inductively coupled plasma (ICP) etching process is carried out by introducing gases of sulfur hexafluoride and oxygen to remove a silicon nitride layer serving as a gate insulating layer and a display panel manufactured thereby.

2. Description of the Prior Art

A liquid crystal display panel mainly includes an array substrate, a color filter (CF) substrate, and liquid crystal molecules filled between the array substrate and the CF substrate. A plurality of pixels are disposed on the array substrate (also called the TFT substrate) in an array, and each of the plurality of pixels is formed with a TFT device to control switch function of each of the plurality of pixels. The array substrate has to be formed by multiple steps of deposition, lithography, and etching to provide a gate, a gate insulating layer, a semiconductor layer, a drain/source, and to pattern a pixel electrode and a passivation layer.

Generally in the process of manufacturing the array substrate, when a film formed by a non-chemical related process, such as a physical vapor deposition (PVD) process or lithography fails due to an unqualified film quality or a machinery crash, this film can be removed and another qualified film can be formed by a rework process. On the other hand, if the films are formed by a chemical related process, such as a chemical vapor deposition (CVD) process, the entire substrate has to be discarded once the film formation fails, the film quality is abnormal, or the machine crashes. Therefore, the manufacturing cost will be increased and the array substrate yield will be adversely affected.

SUMMARY OF THE DISCLOSURE

The present disclosure provides a rework method of a gate insulating layer of a TFT and a display panel manufactured by the rework method to solve the conventional problems of high costs.

In accordance with an embodiment of the present disclosure, a rework method of a gate insulating layer of a TFT including the following steps is provided. First, a substrate includes a silicon nitride layer and the silicon nitride layer is disposed on a surface of the substrate to serve as a gate insulating layer. It is followed by performing a first film removal process to remove the silicon nitride layer on the substrate. The first film removal process includes performing an ICP etching process to etch away the silicon nitride layer. The ICP etching process is carried out by introducing gases including sulfur hexafluoride with a flow rate that is substantially between 300 sccm and 500 sccm, and oxygen with a flow rate that is substantially between 150 sccm and 350 sccm. The process pressure of the ICP etching process is substantially between 80 mtorr and 160 mtorr and the process power of the ICP etching process is substantially between 2000 watts (W) and 3000 W.

In accordance with another embodiment of the present disclosure, a rework method of a gate insulating layer of a TFT including the following steps is provided. First, a glass substrate includes a silicon nitride layer and the silicon nitride layer is disposed on a surface of the glass substrate to serve as the gate insulating layer. It is followed by performing a first film removal process to remove the silicon nitride layer on the glass substrate. The first film removal process includes performing an ICP etching process to etch away the silicon nitride layer, and the ICP etching process has the etching selectivity ratio of the silicon nitride layer to the substrate is substantially between 18 and 30.

In the present disclosure, the rework method of the gate insulating layer of the TFT removes the silicon nitride layer, which serves as the gate insulating layer, by the ICP etching process. Given the manufacturing conditions provided by the present disclosure, the ICP etching process has a high etching selectivity ratio of silicon nitride to glass. As a result, the silicon nitride layer is able to be removed without damaging the glass substrate in order to facilitate the follow-up rework process.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
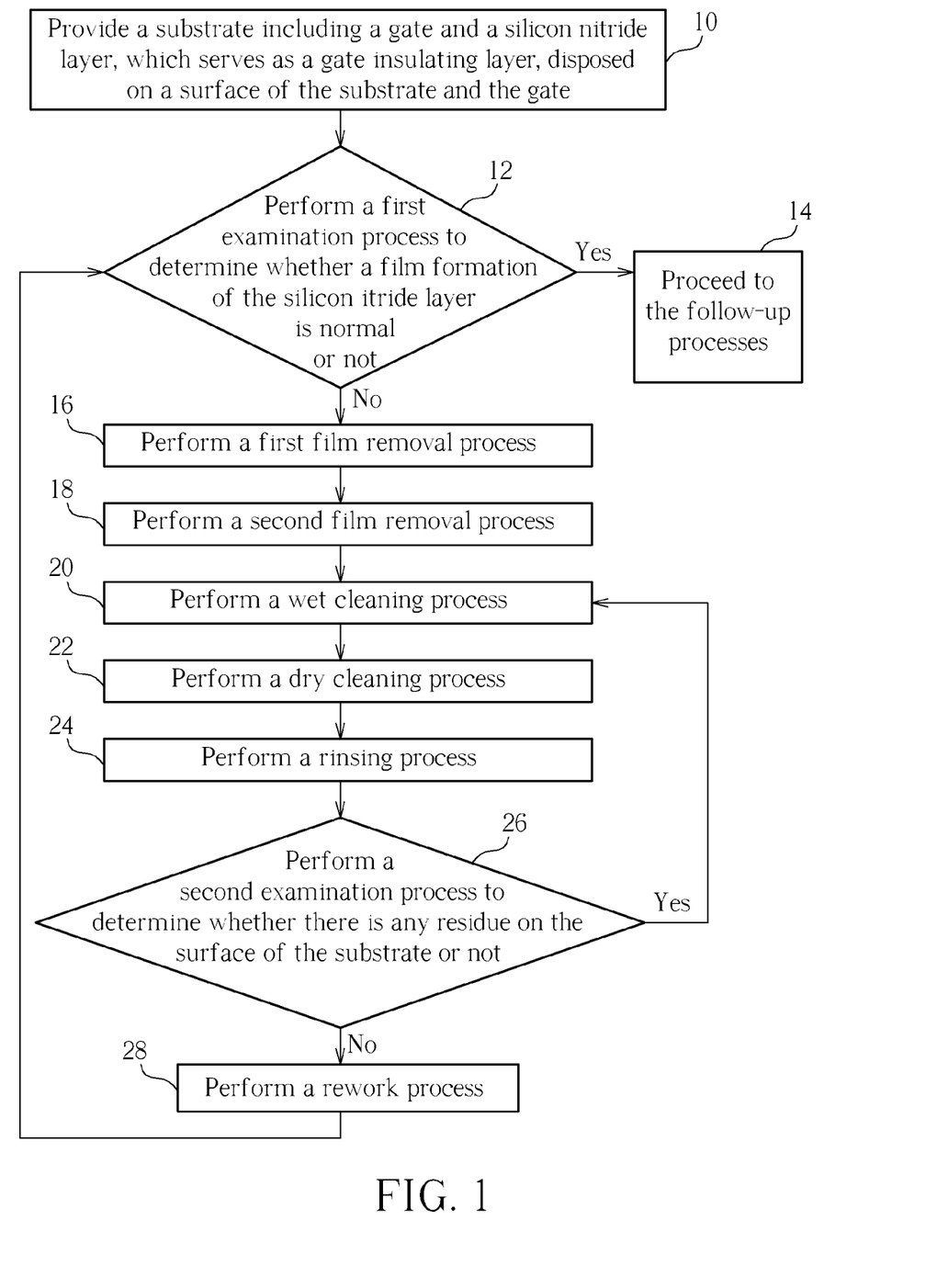
FIG. 1 is a flow chart of a rework method of a gate insulating layer of a TFT according to a preferred embodiment of the present disclosure.

Referring to FIG. 1, which is a flow chart of a rework method of a gate insulating layer of a TFT according to a preferred embodiment of the present disclosure. As shown in FIG. 1, a rework method of a gate insulating layer of a TFT in the present embodiment includes the following steps.

step 10: provide a substrate including a gate and a silicon nitride layer, which serves as a gate insulating layer, disposed on a surface of the substrate and the gate;

step 12: perform a first examination process to determine whether a film formation of the silicon nitride layer is normal or not; if yes, proceed to step 14; if no, proceed to step 16;

step 14: proceed to the follow-up processes;

step 16: perform a first film removal process to remove the silicon nitride layer of the substrate;

step 18: perform a second film removal process to remove the gate;

step 20: perform a wet cleaning process to remove chemical residues on the substrate;

step 22: perform a dry cleaning process to remove organic particles on the substrate;

step 24: perform a rinsing process to clean the surface of the substrate; and step 26: perform a second examination process to determine whether there is any residue on the surface of the substrate or not; if yes, proceed to step 20; if no, proceed to step 28;

step 28: perform a rework process to form another gate and another silicon nitride layer on the substrate in sequence; proceed to step 12 again after the rework process to confirm whether the film formation of the silicon nitride layer that is re-formed is normal or not.

Figure 2:
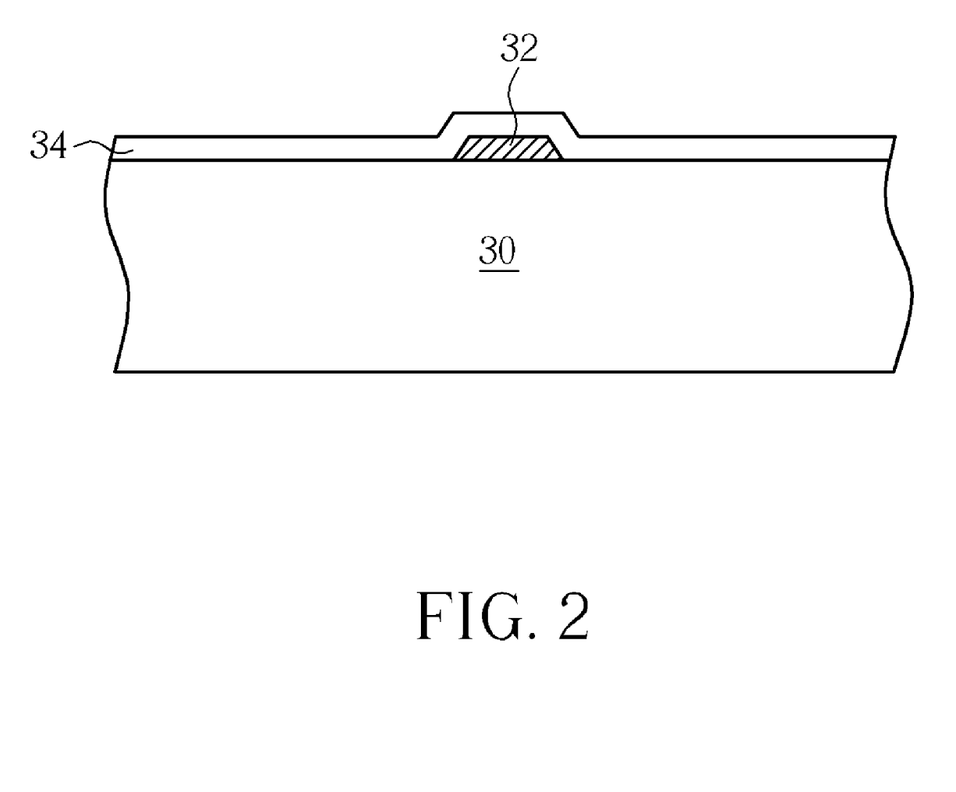
FIGS. 2 to 5 are schematic diagrams illustrating the rework method of the gate insulating layer of the TFT according to a first preferred embodiment of the present disclosure.

Referring to FIGS. 2 to 5 along with FIG. 1, FIGS. 2 to 5 are schematic diagrams illustrating the rework method of the gate insulating layer of the TFT according to a first preferred embodiment of the present disclosure. As shown in FIG. 2, a substrate 30 is provided first, and the substrate 30 is, but not limited to, a glass substrate in the present embodiment. The substrate 30 may be made of other materials. The substrate 30 includes a gate 32 as well as a silicon nitride layer 34 disposed on a surface of the substrate 30 and the gate 32 to serve as a gate insulating layer. For example, the gate 32 may be made of, but not limited to, Al—Nd alloy/Mo, Al/Mo, Mo/Al/Mo, Ti/Al/Ti; conductive materials of other monolayer or composite layers are possible as well. Additionally, the silicon nitride layer 34 is formed on the substrate 30 by a CVD process. Subsequently, a first examination process on the substrate 30 is performed to determine whether a film formation of the silicon nitride layer 34 is normal or not. If the film formation of the silicon nitride layer 34 is normal, follow-up processes will be conducted. Otherwise, if the film formation of silicon nitride layer 34 fails or the film quality is abnormal due to a machinery crash or other unexpected reasons, follow-up film removal processes and rework processes will be performed.

Figure 3:
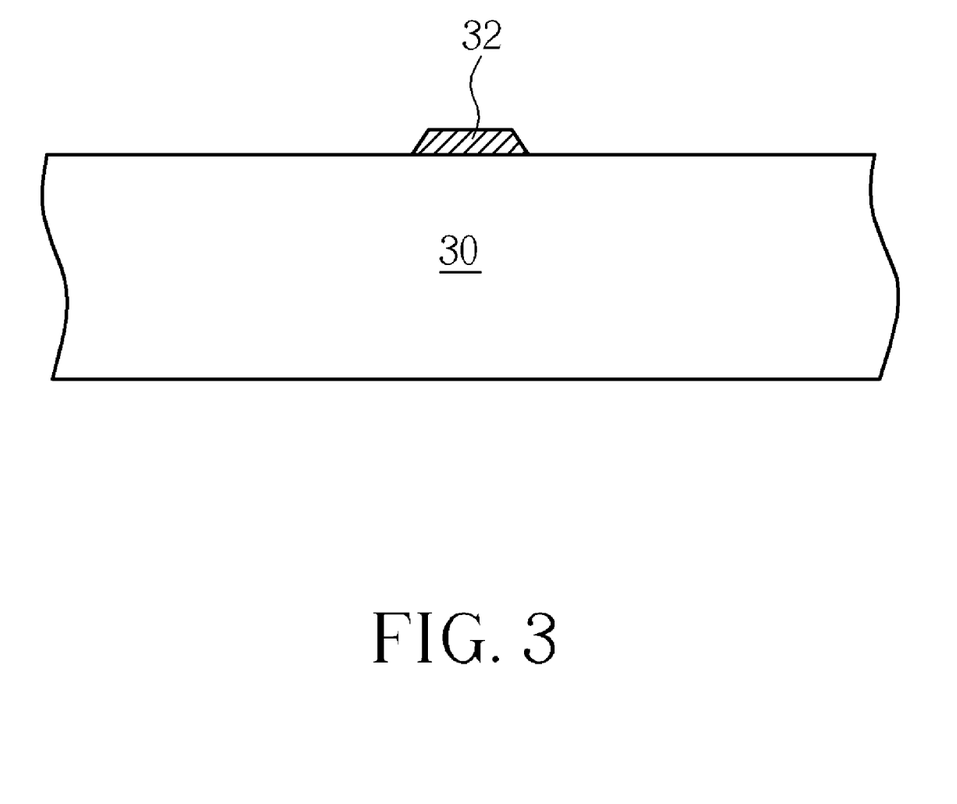

As shown in FIG. 3, when the film formation of silicon nitride layer 34 fails or the film quality is abnormal in the first examination process, the first film removal process will be performed on the substrate 30 to remove the silicon nitride layer 34 on the substrate 30. The first film removal process includes performing an ICP etching process to etch away the silicon nitride layer 34. In the present embodiment, the ICP etching process is carried out by introducing gases including sulfur hexafluoride with a flow rate that is substantially between 300 standard cubic centimeter per minute (sccm) and 500 sccm, and oxygen with a flow rate that is substantially between 150 sccm and 350 sccm. The process pressure of the ICP etching process is, but not limited to, substantially between 80 mtorr and 160 mtorr and the process power of the ICP etching process is, but not limited to, substantially between 2000 W and 3000 W. In addition, when the substrate 30 is the glass substrate, the ICP etching process has an etching selectivity ratio of the a silicon nitride layer 34 to the glass substrate is substantially between 18 and 30 for instance, the etching selectivity ratio of a silicon nitride layer 34 to the glass substrate is substantially 24 so that the silicon nitride layer 34 can be etched away without damaging the surface of the substrate 30.

Figure 4:
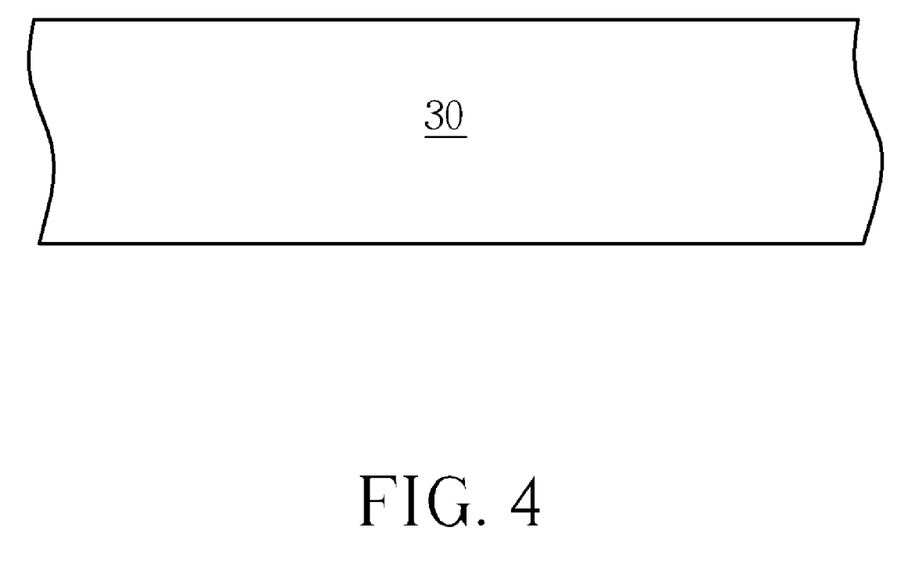

As shown in FIG. 4, after the silicon nitride layer 34 is removed, the second film removal process is performed to remove the gate 32. Different processes may be selected for the second film removal process depending upon the material of the gate 32. For example, when the gate 32 is made of, but not limited to, Al—Nd alloy/Mo, Al/Mo, Mo/Al/Mo, Ti/Al/Ti, the second film removal process may include a wet etching process by using a mixed solution of acetic acid, nitric acid, and phosphoric acid as an etching solution. Moreover, when the gate 32 is made of Ti/Al/Ti, the second film removal process may include a wet etching process by using a mixed solution of nitric acid and hydrochloric acid as an etching solution. However, the second film removal process is not limited to a wet etching process, it is possible to use a dry etching process according to a result of the film removal process. After removing the gate 32, a cleaning process is performed on the substrate 30. The cleaning process may include a wet cleaning process, a dry cleaning process, and a rinsing process, wherein the wet cleaning process removes chemical residues on the substrate 30 by a rinsing liquid, the dry cleaning process removes organic particles on the substrate 30 by a ultraviolet light, and the rinsing process cleans the surface of the substrate 30 by deionized (DI) water so that the adherence between the substrate 30 and the follow-up layers will be increased. Subsequent to the cleaning process, the second examination process is performed to determine whether there is any residue on the surface of the substrate 30 or not. If there is, the cleaning process may be repeated, the parameters of the wet cleaning process, the dry cleaning process, and the rinsing process may be adjusted, or else, the step sequence and the number of times of the cleaning process may be changed till that there is no residue on the surface of the substrate 30.

Figure 5:
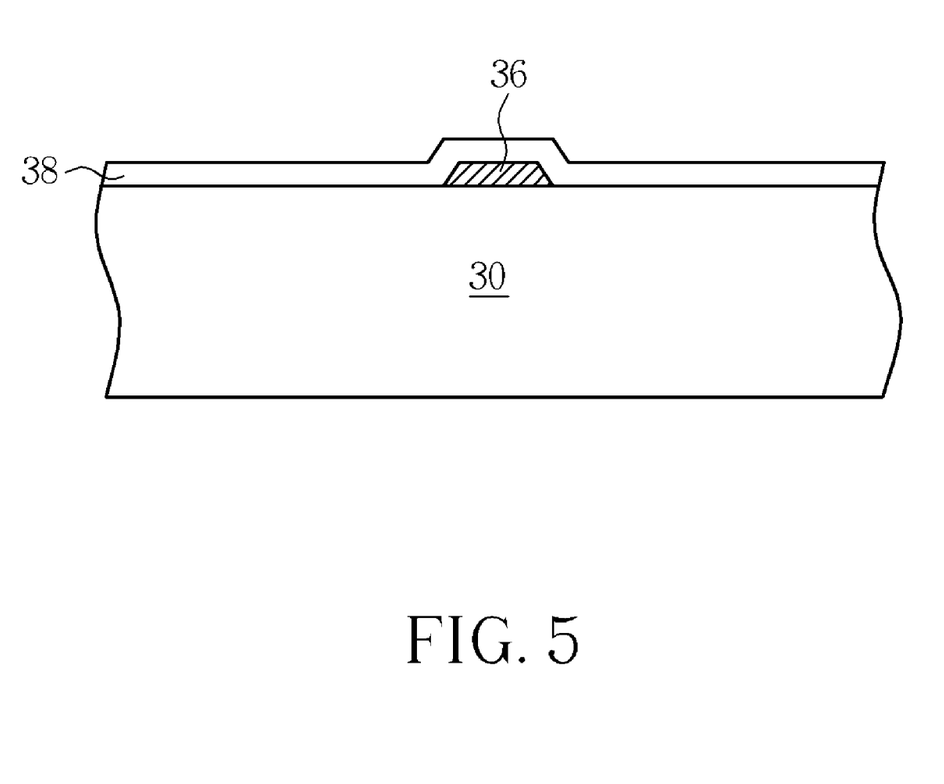

As shown in FIG. 5, when there is no residue on the surface of the substrate 30, a rework process will be performed. Another gate 36 and another silicon nitride layer 38 are formed in sequence on the substrate 30. After the silicon nitride layer 38 is formed, the first examination process may be conducted again to determine whether the film formation of the silicon nitride layer 38 is normal or not. If the film formation of the silicon nitride layer 38 is considered normal, it may proceed to the follow-up processes. Otherwise, if the film formation of the silicon nitride layer 38 fails or the film quality is abnormal, follow-up film removal processes and rework processes will be performed till that the film formation of the silicon nitride layer becomes normal.

Figure 6:
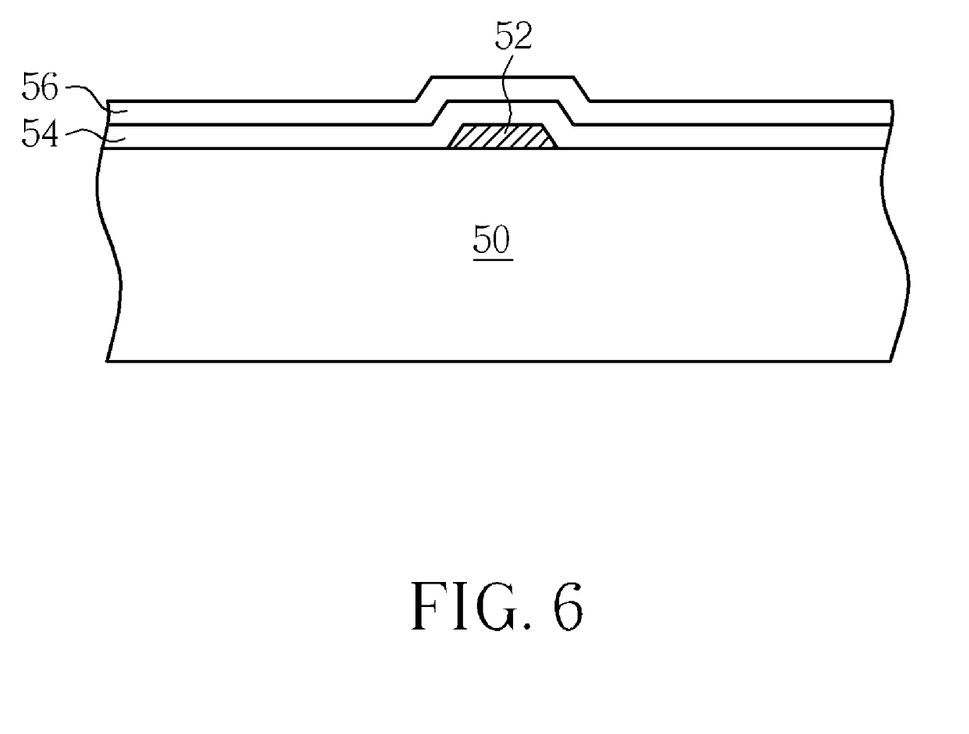
FIGS. 6 to 9 are schematic diagrams illustrating the rework method of the gate insulating layer of the TFT according to a second preferred embodiment of the present disclosure.

The sequence of the rework process of the gate insulating layer of the TFT and the formation of the gate insulating layer may be changed in the present disclosure. That is, the rework process of the gate insulating layer of the TFT may be performed immediately after the gate insulating layer is formed, or it may be performed after the further layers, such as the semiconductor layer, is formed. Referring to FIGS. 6 to 9, FIGS. 6 to 9 are schematic diagrams illustrating the rework method of the gate insulating layer of the TFT according to a second preferred embodiment of the present disclosure. In order to simplify the description as well as to compare the similarities and dissimilarities of the two embodiments, the difference between those is highlighted. First, as shown in FIG. 6, a substrate 50, such as, but not limited to, a glass substrate, is provided. The difference between the present and the first embodiments lies in that the substrate 50 includes a gate 52 and a silicon nitride layer 54 to serve as the gate insulating layer, and in addition to them, the substrate 50 further includes at least a semiconductor layer 56 disposed on the silicon nitride layer 54. The semiconductor layer 56 may be an amorphous silicon layer, a microcrystalline silicon layer, a monocrystalline silicon layer, a polycrystalline silicon layer, a silicon carbide layer, an oxide semiconductor layer, other suitable materials, or a stacked layer including the previously-mentioned material layers. Subsequently, a first examination process is performed on the substrate 50 to determine whether a film formation of the semiconductor layer 56 and/or the silicon nitride layer 54 is normal or not. If the film formation of the semiconductor layer 56 and/or the silicon nitride layer 54 is considered normal, it will proceed to the follow-up processes. Otherwise, if the film formation of the semiconductor layer 56 and/or a silicon nitride layer 54 fails or the film quality is abnormal after the examination process, it will be followed by the subsequent film removal and rework processes.

Figure 7:
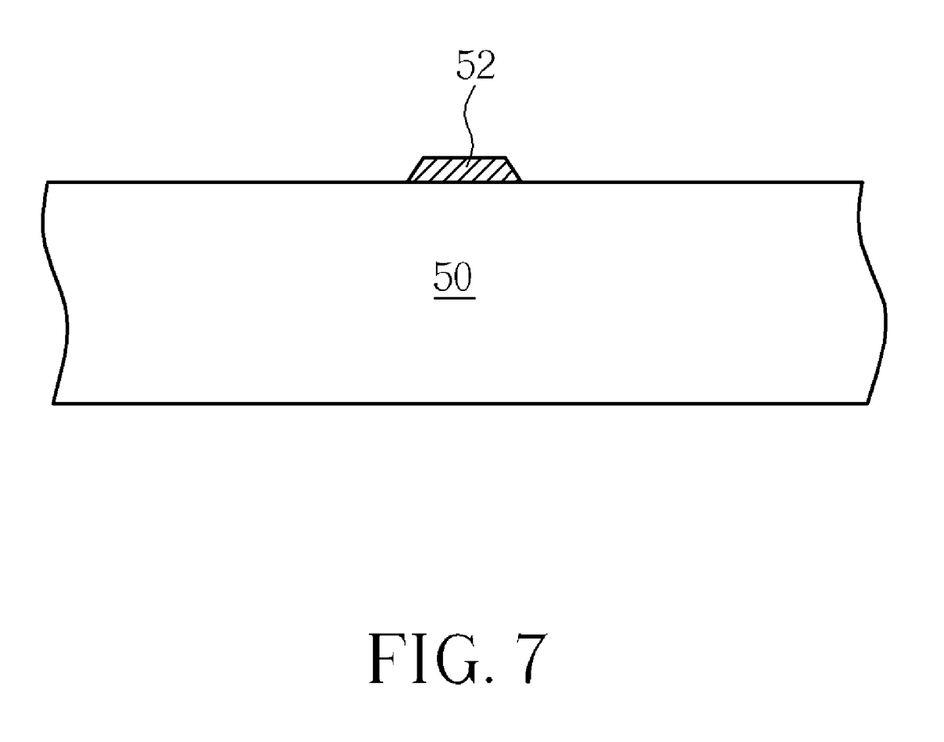

As shown in FIG. 7, when the film formation of the semiconductor layer 56 and/or the silicon nitride layer 54 fails or the film quality is abnormal in the first examination process, a first film removal process will be performed on the substrate 50 to remove the semiconductor layer 56 and the silicon nitride layer 54 on the substrate 50. The first film removal process includes performing an ICP etching process to etch away the semiconductor layer 56 and the silicon nitride layer 54. In the present embodiment, the ICP etching process is carried out by introducing gases including sulfur hexafluoride and oxygen, wherein a flow rate of sulfur hexafluoride is substantially between 300 sccm and 500 sccm, and a flow rate of oxygen is substantially between, but not limited to, 150 sccm and 350 sccm. The process pressure of the ICP etching process is substantially between, but not limited to, 80 mtorr and 160 mtorr and the process power of the ICP etching process is substantially between 2000 W and 3000 W. Additionally, in the process of etching away the silicon nitride layer 54, the ICP etching process has an etching selectivity ratio of the silicon nitride layer 54 to the glass substrate is substantially between 18 and 30. For example the etching selectivity ratio of the silicon nitride layer 54 to the glass substrate is substantially 24 so that the silicon nitride layer 54 can be etched away without damaging the substrate of the substrate 50. It is to be noted that the ICP etching process may etch away the semiconductor layer 56 and the silicon nitride layer 54 all together in the present embodiment, but the present disclosure is not only applied to this embodiment. In another word, the semiconductor layer 56 and the silicon nitride layer 54 may be removed in separate processes.

Figure 8:
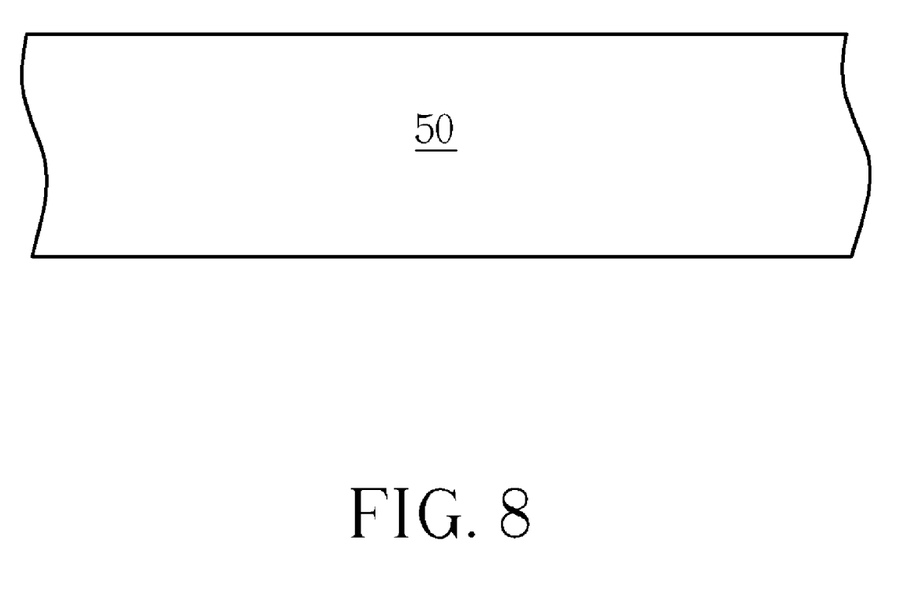
Figure 9:
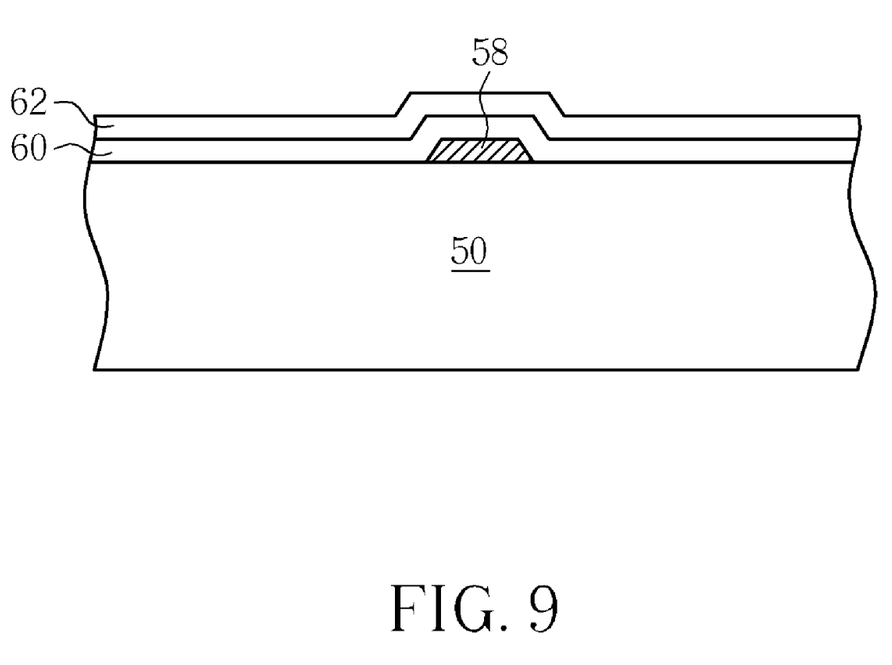

As shown in FIG. 8, a second film removal process is then performed to remove the gate 52 subsequent to removing the semiconductor layer 56 and the silicon nitride layer 54. Different processes may be selected for the second film removal process depending upon the material of the gate 52, which is omitted in the description. Next, a cleaning process is performed on the substrate 50, and types and sequences of the cleaning process have been specified above. As shown in FIG. 9, it is followed by a rework process, and forming another gate 58, another silicon nitride layer 60 as well as another semiconductor layer 62 on the substrate 50.

As described previously, in the present disclosure the ICP etching process is used to remove the gate insulating layer when it is abnormal and then another gate insulating layer is formed by the rework process. It is to be noted that the ICP etching process is carried out by introducing gases including sulfur hexafluoride and oxygen. The gas flow rate, process pressure, and process power are all controlled in a range described below:

The flow rate of sulfur hexafluoride is substantially between 300 sccm and 500 sccm;

The flow rate of oxygen is substantially between 150 sccm and 350 sccm;

The process pressure of the ICP etching process is substantially between 80 mtorr and 160 mtorr; and The process power of the ICP etching process is substantially between 2000 W and 3000 W.

Figure 10:
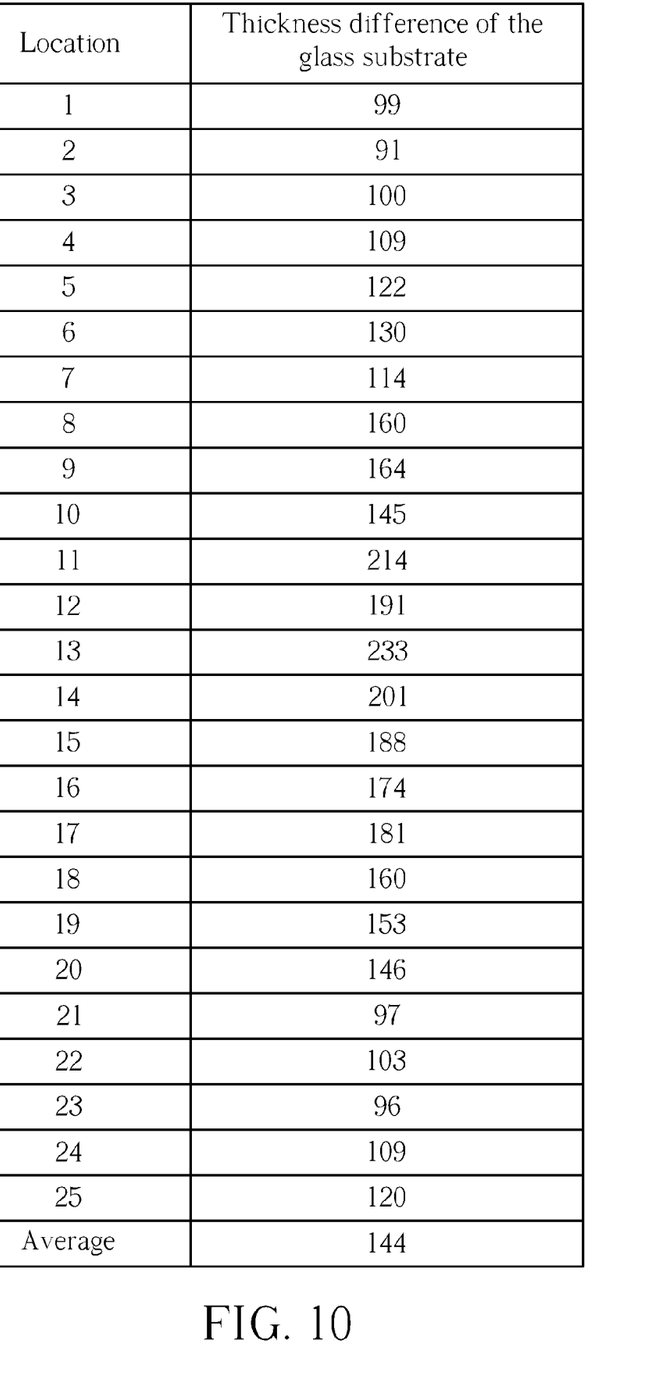
FIG. 10 illustrates a thickness difference between the glass substrate not covered by the gate and that covered by the gate after the silicon nitride layer is etched away.

Given the manufacturing conditions provided by the present disclosure, the etching selectivity ratio of the ICP etching process to the silicon nitride layer can be set to a range between 18 and 30, such as 24. As a result, during the process of etching away the silicon nitride layer, the surface of the substrate will not be damaged and the substrate may be reused in the rework process of the silicon nitride layer. Referring to FIG. 10, FIG. 10 illustrates a thickness difference between the glass substrate not covered by the gate and that covered by the gate after the silicon nitride layer is etched away. As shown in FIG. 10, the differences between the original thickness of the glass substrate and the thickness of the glass substrate after the ICP etching process are measured at 25 different locations on the glass substrate. The differences are substantially ranged between 90 Å (angstrom) and 230 Å, and the average value of the thickness differences of the glass substrate is around 144 Å. The experimental result shows that given the manufacturing conditions of the ICP etching process provided by the present disclosure, the ICP etching process can have an excellent etching selectivity ratio of silicon nitride to glass. As a result, the thickness of the glass substrate will only be slightly decreased and the silicon nitride layer is being etched away so that a superior evenness of the substrate surface can be maintained. Due to the improved evenness of the glass substrate after removing the silicon nitride layer, a good exposure effect of a photoresist is able to be achieved in lithography for forming other layers in the following rework processes.

Figure 11:
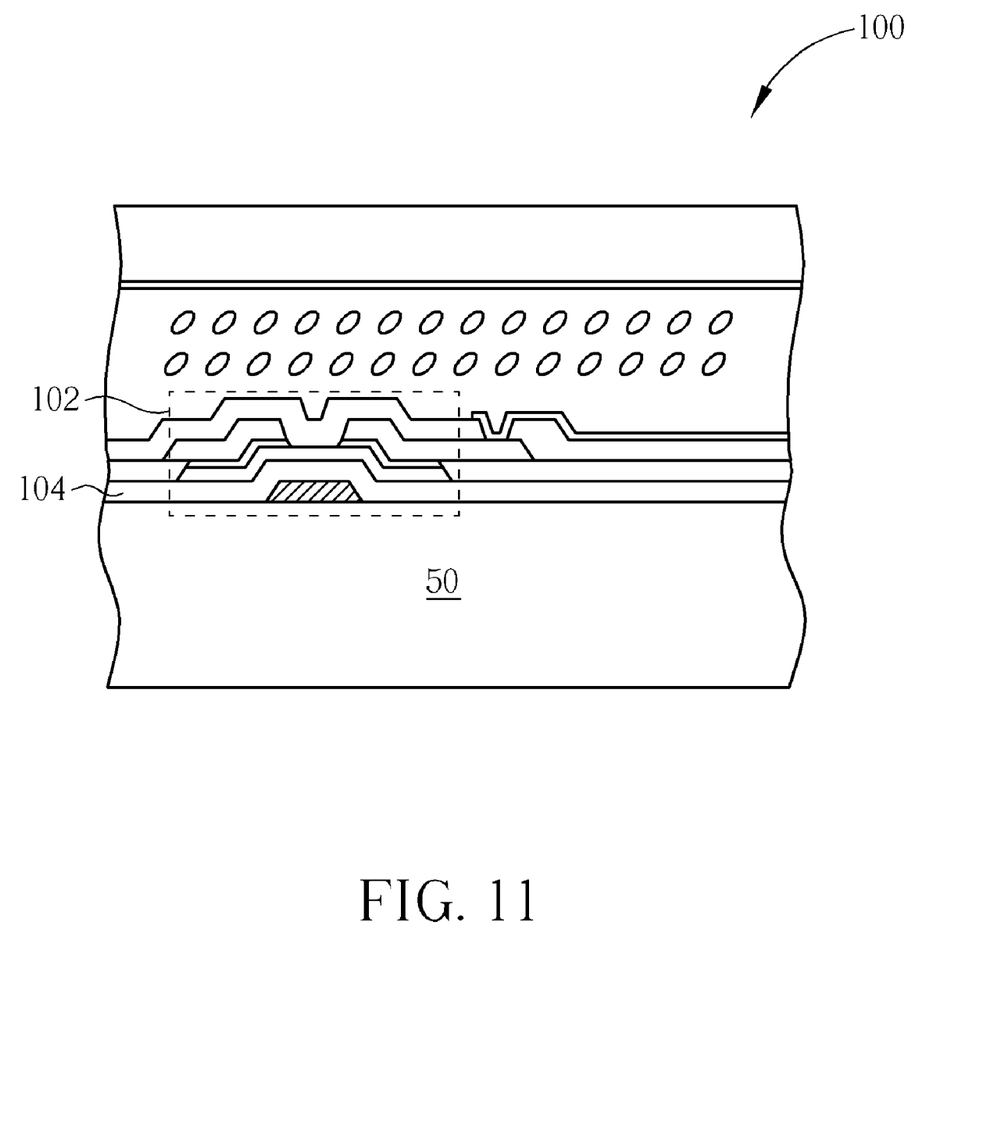
FIG. 11 is a schematic diagram illustrating a display panel according to a preferred embodiment of the present disclosure.

Referring to FIG. 11, FIG. 11 is a schematic diagram illustrating a display panel according to a preferred embodiment of the present disclosure. As shown in FIG. 11, the display panel 100 of the present embodiment may be a liquid crystal display panel, an organic luminescent display panel, an electrophoretic display panel, or other typed display panels. The display panel 100 includes a TFT 102, and the TFT 102 includes a silicon nitride layer 104 to serve as a gate insulating layer. In the present embodiment, the silicon nitride layer 104 of the TFT 102 is formed by the previously-mentioned rework method of the gate insulating layer of the TFT.

In summary, the silicon nitride layer formed by a CVD process is removed by the rework method of the gate insulating layer of the TFT by an ICP etching process in the present disclosure. Given the manufacturing conditions provided by the present disclosure, the ICP etching process can have a high etching selectivity ratio of the silicon nitride layer to the substrate so that the silicon nitride layer is able to be etched away without damaging the glass substrate. Moreover, even after removing the silicon nitride layer, the thickness evenness of the glass substrate will still be maintained so that the subsequent rework processes can be conducted smoothly. Therefore, the present disclosure can prevent the conventional problems of the glass substrate with an abnormal film formation caused by discard of the silicon nitride layer from happening, which further prevents an increased cost.

Those skilled in the art will readily observe that numerous modifications and alterations of the device and method may be made while retaining the teachings of the disclosure.

What is claimed is:

1. A rework method of a gate insulating layer of a thin film transistor (TFT), comprising steps of:

providing a substrate, the substrate including a silicon nitride layer disposed on a surface of the substrate to serve as a gate insulating layer, and a gate disposed between the substrate and the silicon nitride layer;

performing a first film removal process to remove the silicon nitride layer on the substrate, the first film removal process comprising performing an inductively coupled plasma (ICP) etching process to etch the silicon nitride layer, wherein the ICP etching process is carried out by introducing gases including sulfur hexafluoride with a flow rate that is substantially between 300 sccm and 500 sccm, and oxygen with a flow rate that is substantially between 150 sccm and 350 sccm, and wherein a process pressure of the ICP etching process is substantially between 80 mtorr and 160 mtorr, and a process power of the ICP etching process is substantially between 2000 W and 3000 W; and performing a second film removal process to remove the gate.

2. The rework method of claim 1, wherein the flow rate of sulfur hexafluoride is substantially 400 sccm, the flow rate of oxygen is substantially 200 sccm, the process pressure of the ICP etching process is substantially 120 mtorr, and the process power of the ICP etching process is substantially 2500 W.

3. The rework method of claim 1, wherein the substrate includes a glass substrate.

4. The rework method of claim 1, further comprising forming another gate and another silicon nitride layer on the substrate in sequence following the step of performing the second film removal process.

5. The rework method of claim 1, wherein the substrate further comprises a semiconductor layer disposed on the silicon nitride layer, and the first film removal process further comprises removing the semiconductor layer.

6. The rework method of claim 3, wherein the ICP etching process has an etching selectivity ratio of the silicon nitride layer to the substrate is substantially between 18 and 30.

7. The rework method of claim 6, wherein the ICP etching process has the etching selectivity ratio of the silicon nitride layer to the substrate is substantially 24.

8. The rework method of claim 5, wherein the semiconductor layer includes an amorphous silicon layer.

9. A display panel comprising a TFT, the TFT including a silicon nitride layer to serve as a gate insulating layer, wherein the silicon nitride layer is formed by the rework method of claim 4.

10. A rework method of a gate insulating layer of a TFT, comprising steps of:

providing a glass substrate, the glass substrate including a silicon nitride layer disposed on a surface of the glass substrate to serve as a gate insulating layer; and performing a first film removal process to remove the silicon nitride layer on the glass substrate, the first film removal process comprising performing an ICP etching process to etch the silicon nitride layer, wherein the ICP etching process has an etching selectivity ratio of the silicon nitride layer to the glass substrate is substantially between 18 and 30.

11. The rework method of claim 10, wherein the ICP etching process has the etching selectivity ratio of the silicon nitride layer to the glass substrate is substantially 24.

12. The rework method of claim 10, wherein the ICP etching process is carried out by introducing gases including sulfur hexafluoride with a flow rate that is substantially between 300 sccm and 500 sccm, and oxygen with a flow rate that is substantially between 150 sccm and 350 sccm, and wherein a process pressure of the ICP etching process is substantially between 80 mtorr and 160 mtorr, and a process power of the ICP etching process is substantially between 2000 W and 3000 W.

13. The rework method of claim 10, wherein the flow rate of sulfur hexafluoride is substantially 400 sccm, the flow rate of oxygen is substantially 200 sccm, the process pressure of the ICP etching process is substantially 120 mtorr, and the process power of the ICP etching process is substantially 2500 W.

14. The rework method of claim 10, wherein the glass substrate further comprises a gate disposed between the glass substrate and the silicon nitride layer, and the rework method further comprises performing a second film removal process to remove the gate.

15. The rework method of claim 10, wherein the glass substrate further comprises a semiconductor layer disposed on the silicon nitride layer, and wherein the first film removal process further comprises removing the semiconductor layer.

16. The rework method of claim 14, further comprising forming another gate and another silicon nitride layer on the glass substrate in sequence following the step of performing the second film removal process.

17. The rework method of claim 15, wherein the semiconductor layer includes an amorphous silicon layer.

18. A display panel comprising a TFT, the TFT including a silicon nitride layer to serve as a gate insulating layer, wherein the silicon nitride layer is formed by the rework method of claim 16.

* * * * *